United States Patent
Bierhuizen

(10) Patent No.: US 10,868,224 B2
(45) Date of Patent: Dec. 15, 2020

(54) WAVELENGTH CONVERTED LIGHT EMITTING DEVICE

(71) Applicant: Lumileds LLC, San Jose, CA (US)

(72) Inventor: Serge Joel Armand Bierhuizen, San Jose, CA (US)

(73) Assignee: Lumileds LLC, San Jose, CA (US)

(*) Notice: Subject to any disclaimer, the term of this patent is extended or adjusted under 35 U.S.C. 154(b) by 331 days.

(21) Appl. No.: 14/997,713

(22) Filed: Jan. 18, 2016

(65) Prior Publication Data

US 2016/0133803 A1  May 12, 2016

Related U.S. Application Data

(62) Division of application No. 14/375,461, filed as application No. PCT/IB2013/051009 on Feb. 7, 2013, now Pat. No. 9,257,617.

(60) Provisional application No. 61/597,358, filed on Feb. 10, 2012.

(51) Int. Cl.
| | |
|---|---|
| *H01L 33/50* | (2010.01) |
| *H01L 33/36* | (2010.01) |
| *H01L 21/683* | (2006.01) |
| *H01L 21/66* | (2006.01) |
| *H01L 33/52* | (2010.01) |
| *H01L 33/00* | (2010.01) |
| *H01L 27/15* | (2006.01) |

(52) U.S. Cl.
CPC ........ *H01L 33/505* (2013.01); *H01L 21/6836* (2013.01); *H01L 22/14* (2013.01); *H01L 27/156* (2013.01); *H01L 33/0095* (2013.01); *H01L 33/36* (2013.01); *H01L 33/502* (2013.01); *H01L 33/52* (2013.01); *H01L 2221/68336* (2013.01); *H01L 2933/005* (2013.01); *H01L 2933/0033* (2013.01); *H01L 2933/0041* (2013.01)

(58) Field of Classification Search
None
See application file for complete search history.

(56) References Cited

U.S. PATENT DOCUMENTS

| | | | |
|---|---|---|---|
| 5,770,867 | A | 6/1998 | Sata et al. |
| 7,276,736 | B2 | 10/2007 | Hohn et al. |

(Continued)

FOREIGN PATENT DOCUMENTS

| | | |
|---|---|---|
| DE | 102008010512 | 8/2009 |
| EP | 1643566 | 5/2006 |

(Continued)

OTHER PUBLICATIONS

International Search Report and Written Opinion from International Application No. PCT/IB2013/051009 dated Aug. 3, 2013.

*Primary Examiner* — Erik T. K. Peterson
(74) *Attorney, Agent, or Firm* — Volpe Koenig

(57) ABSTRACT

Embodiments of the invention include a semiconductor structure comprising a light emitting layer. The semiconductor structure is attached to a support such that the semiconductor structure and the support are mechanically self-supporting. A wavelength converting material extends over the sides of the semiconductor structure and the support, wherein the wavelength converting material has a substantially uniform thickness over the top and sides of the semiconductor structure and the support.

16 Claims, 3 Drawing Sheets

(56) References Cited

U.S. PATENT DOCUMENTS

| | | | |
|---|---|---|---|
| 7,344,952 B2* | 3/2008 | Chandra | H01L 33/505 257/E21.352 |
| 7,521,862 B2 | 4/2009 | Mueller et al. | |
| 7,601,550 B2 | 10/2009 | Bogner | |
| 7,692,259 B2 | 4/2010 | Suehiro | |
| 8,017,246 B2 | 9/2011 | Morita et al. | |
| 8,030,672 B2 | 10/2011 | Harada | |
| 8,207,552 B2 | 6/2012 | Yoo | |
| 8,399,275 B2 | 3/2013 | Akimoto et al. | |
| 8,541,798 B2 | 9/2013 | Ooya et al. | |
| 8,569,083 B2 | 10/2013 | Lu et al. | |
| 8,664,635 B2 | 3/2014 | Jung et al. | |
| 8,704,254 B2 | 4/2014 | Trottier et al. | |
| 8,704,262 B2 | 4/2014 | Livesay et al. | |
| 8,759,125 B2 | 6/2014 | Tischler | |
| 8,957,429 B2 | 2/2015 | Wang et al. | |
| 9,046,634 B2 | 6/2015 | Shchekin et al. | |
| 9,087,974 B2 | 7/2015 | Kimura et al. | |
| 2005/0130390 A1* | 6/2005 | Andrews | B23K 26/0057 438/458 |
| 2006/0118510 A1* | 6/2006 | Fujii | H01L 33/505 216/24 |
| 2006/0226758 A1 | 10/2006 | Sofue | |
| 2007/0045653 A1 | 3/2007 | Krames et al. | |
| 2007/0085105 A1 | 4/2007 | Beeson et al. | |
| 2007/0096131 A1* | 5/2007 | Chandra | H01L 33/505 257/99 |
| 2008/0076316 A1* | 3/2008 | Negley | H01L 33/501 445/23 |
| 2008/0121911 A1* | 5/2008 | Andrews | H01L 33/58 257/98 |
| 2008/0179611 A1* | 7/2008 | Chitnis | H01L 33/508 257/98 |
| 2008/0290351 A1 | 11/2008 | Ajiki | |
| 2009/0057690 A1* | 3/2009 | Chakraborty | H01L 33/44 257/88 |
| 2009/0173960 A1 | 7/2009 | Martin et al. | |
| 2009/0179207 A1* | 7/2009 | Chitnis | H01L 33/44 257/88 |
| 2009/0261358 A1* | 10/2009 | Chitnis | H01L 33/0095 257/88 |
| 2010/0140633 A1* | 6/2010 | Emerson | H01L 25/0753 257/88 |
| 2010/0155750 A1* | 6/2010 | Donofrio | H01L 33/005 257/91 |
| 2010/0190280 A1* | 7/2010 | Horiuchi | H01L 21/6836 438/28 |
| 2010/0279437 A1 | 11/2010 | Neff | |
| 2010/0308354 A1* | 12/2010 | David | H01L 33/507 257/98 |
| 2011/0175117 A1 | 7/2011 | Jagt | |
| 2011/0198780 A1* | 8/2011 | Basin | H01L 33/50 264/266 |
| 2011/0297980 A1* | 12/2011 | Sugizaki | H01L 33/38 257/98 |
| 2011/0300644 A1* | 12/2011 | Akimoto | H01L 33/508 438/7 |
| 2012/0061703 A1 | 3/2012 | Kobayashi | |
| 2012/0193670 A1 | 8/2012 | Son et al. | |
| 2013/0139868 A1 | 6/2013 | Zhang et al. | |
| 2013/0264600 A1 | 10/2013 | Lee et al. | |
| 2013/0320382 A1 | 12/2013 | Kojima et al. | |
| 2014/0179029 A1 | 6/2014 | Bhat et al. | |
| 2014/0198528 A1 | 7/2014 | Klim et al. | |
| 2015/0084537 A1 | 3/2015 | Choi et al. | |

FOREIGN PATENT DOCUMENTS

| | | |
|---|---|---|
| EP | 2393131 | 12/2011 |
| JP | 2011253882 | 12/2011 |

* cited by examiner

WAVELENGTH CONVERTED LIGHT EMITTING DEVICE

CROSS-REFERENCES TO PRIOR APPLICATIONS

This application is a divisional of U.S. application Ser. No. 14/375,461, filed Jul. 30, 2014, which is a U.S. National Phase application under 35 U.S.C. 371 of International Application No. PCT/IB2013/051009, filed on Feb. 7, 2013, which claims the benefit of U.S. Provisional Application No. 61/597,358, filed on Feb. 10, 2012. These applications are hereby incorporated by reference herein.

BACKGROUND

Field of Invention

The present invention relates to a wavelength-converted semiconductor light emitting device on a chip-scale package.

Description of Related Art

Semiconductor light-emitting devices including light emitting diodes (LEDs), resonant cavity light emitting diodes (RCLEDs), vertical cavity laser diodes such as surface-emitting lasers (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

III-nitride light emitting devices often emit blue or UV light. To form an LED that emits white light, one or more wavelength converting materials such as phosphors are often disposed in the path of the blue or UV light emitted from the LED. For example, for an LED that emits blue light, a single phosphor that emits yellow light may be used, or two phosphors that emit green and red light may be used. Some of the light emitted by the LED is wavelength-converted by the phosphor. The wavelength-converted light emitted by the phosphor mixes with unconverted light emitted by the LED such that the overall appearance of light from the device is white.

FIG. 1 illustrates a process for forming a wavelength-converted light emitting device mounted on a chip-scale package, described in more detail in US 2010/0279437. A chip-scale package refers to a package for the light emitting device that is attached to the semiconductor light emitting device structure in a wafer-scale process. In process 102 of FIG. 1, LEDs are formed on a growth wafer. In process 104, a carrier wafer is temporarily bonded to the device wafer. A removable adhesive is first applied over the top of the device wafer then a carrier wafer is bonded to the top of the device wafer. In process 106, the device wafer is flipped over and the growth wafer is removed. In process 108, the n-type layer exposed by removing the growth wafer is roughened to improve light extraction. In process 110, a window wafer is bonded to the device wafer. The window wafer provides mechanical strength to the device wafer for subsequent processing. The window wafer may include a wavelength converting structure for modifying the emission spectrum to provide a desired color such as amber for signal lights or multiple colors for a white light emitter. The structure may be a ceramic phosphor, a suitable transparent substrate or carrier such as a sapphire or glass layer, or a filter such as a distributed Bragg reflector. In process 112, the carrier wafer is removed from the device wafer. In process 114, the device wafer is mounted from the bottom side to a stretch film. The stretch film may be a blue tape, a white tape, a UV tape, or other suitable materials that allows adhesion to a flexible (expandable) substrate. In process 116, the LEDs in the device wafer are singulated into individual dice, for example using a laser, a scribe, or a saw. The LED dice may have edge emission that degrades color-over-angle uniformity. In process 118, the stretch film is expanded to laterally separate the LED dice to create the spaces between neighboring dice. In process 120, a reflective coating is applied over the tops of the LEDs and in the spaces between them. In process 122, the reflective coating in the spaces between the LED dice is optionally broken or weakened (e.g., cleaved). In process 124, the stretch film is expanded again to further laterally separate the LED dice. In process 126, portions of the reflective coating on the top of the LED dice is removed. Afterwards only portions of the reflective coating on the sides of the LED dice remains. Portions of the reflective coating on the sides of the LED dice may control edge emission, improve color-over-angle uniformity, and improve brightness. In process 128, the LEDs are flipped over and transferred to another stretch film to expose n-type bond pads and p-type bond pads on the LED dice for testing in process 130.

SUMMARY

It is an object of the invention to provide a wavelength converted light emitting device where leakage of unconverted light from the sides of the light emitting device is reduced or eliminated.

Embodiments of the invention include a semiconductor structure comprising a light emitting layer. The semiconductor structure is attached to a support such that the semiconductor structure and the support are mechanically self-supporting. A wavelength converting material extends over the sides of the semiconductor structure and the support. In some embodiments, the thickness of the wavelength converting material varies less than 20% over the top and sides of the semiconductor structure and the support.

A method according to embodiments of the invention includes attaching a plurality of light emitting devices to a substrate. Each light emitting device includes a support attached to a semiconductor structure comprising a light emitting layer. Each light emitting device is mechanically self-supporting. Neighboring devices are spaced apart on the substrate. A wavelength converting material is disposed over the plurality of light emitting devices. The wavelength converting material extends over the sides of each semiconductor structure and support.

DETAILED DESCRIPTION

Figure 1:
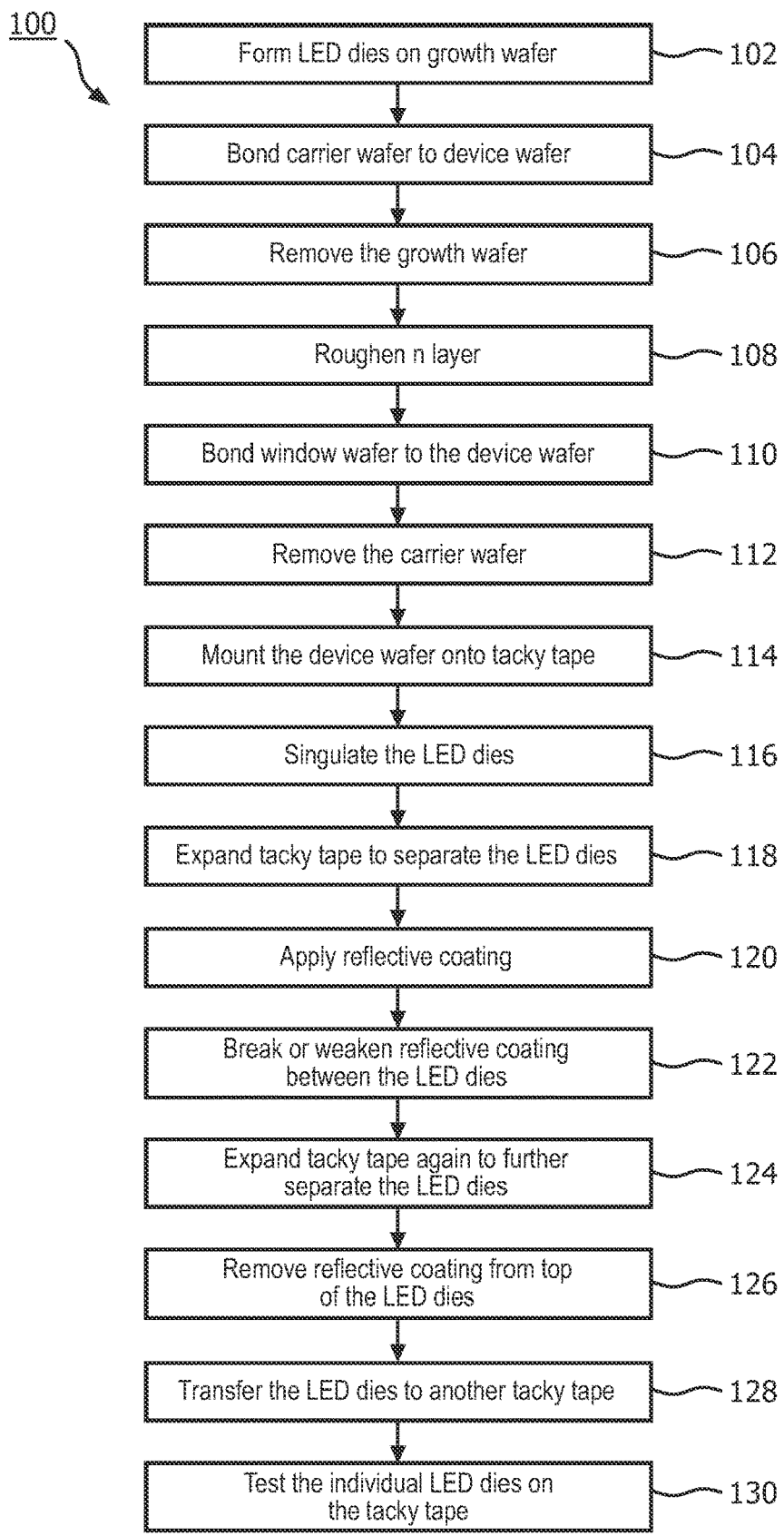
FIG. 1 illustrates a method of forming a wavelength-converted LED.

In a structure formed by the method illustrated in FIG. 1, leakage of unconverted light from the sides of a chip-scale packaged light emitting device is prevented or reduced by forming a reflective material on the sides of the light emitting device. In embodiments of the invention, wavelength converting material rather than a reflective material is formed on the sides of a chip-scale packaged light emitting device.

Figure 2:
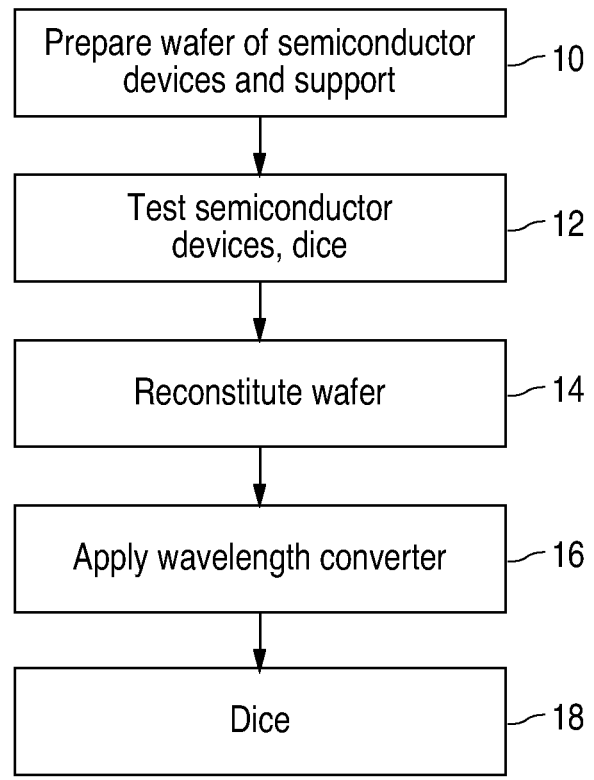
FIG. 2 illustrates a method of forming a wavelength-converted light emitting device according to embodiments of the invention.

FIG. 2 illustrates a method of forming a wavelength-converted semiconductor light emitting device according to embodiments of the invention. Though in the discussion below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 3:
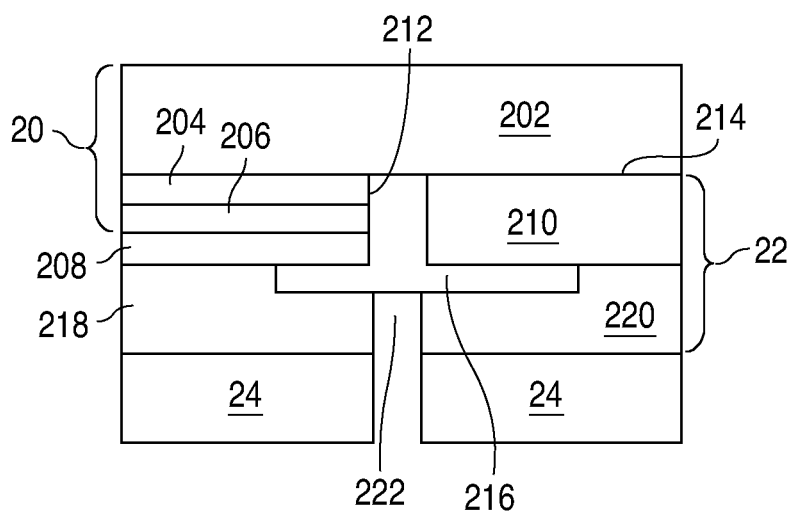
FIG. 3 is a cross sectional view of a semiconductor structure attached to a support.

In stage 10, a wafer of semiconductor devices attached to a mechanical support is prepared. FIG. 3 is a cross sectional view of a portion of a wafer of semiconductor light emitting devices attached to a support. To form the structure of FIG. 3, a semiconductor structure 20 is first grown on a growth substrate (not shown in FIG. 3) as is known in the art. The growth substrate may be any suitable substrate such as, for example, sapphire, SiC, Si, GaN, or composite substrates. The semiconductor structure 20 includes a light emitting or active region sandwiched between n- and p-type regions. An n-type region may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region is grown over the n-type region. Examples of suitable light emitting regions include a single thick or thin light emitting layer, or a multiple quantum well light emitting region including multiple thin or thick light emitting layers separated by barrier layers. A p-type region may then be grown over the light emitting region. Like the n-type region, the p-type region may include multiple layers of different composition, thickness, and dopant concentration, including layers that are not intentionally doped, or n-type layers. The total thickness of all the semiconductor material in the device is less than 10 µm in some embodiments and less than 6 µm in some embodiments.

A metal p-contact is formed on the p-type region. If a majority of light is directed out of the semiconductor structure through a surface opposite the p-contact, such as in a flip chip device, the p-contact may be reflective. A flip chip device may be formed by patterning the semiconductor structure by standard photolithographic operations and etching the semiconductor structure to remove a portion of the entire thickness of the p-type region and a portion of the entire thickness of the light emitting region, to form a mesa which reveals a surface of the n-type region on which a metal n-contact is formed. The mesa and p- and n-contacts may be formed in any suitable manner. Forming the mesa and p- and n-contacts is well known to a person of skill in the art and is not illustrated in FIG. 3. In the regions between devices, the semiconductor structure 20 is etched down to an insulating layer, which may be an insulating semiconductor layer that is part of the semiconductor structure 20, or the growth substrate.

The p- and n-contacts may be redistributed by a stack of insulating layers and metals as is known in the art to form at least two large electrical pads. One of the electrical pads is electrically connected to the p-type region of the semiconductor structure 20 and the other of the electrical pads is electrically connected to the n-type region of the semiconductor structure 20. Electrical pads may be any suitable conductive material including, for example, copper, gold, and alloys. The electrical pads are electrically isolated from each other by a gap which may be filled with an insulating material such as a dielectric, air, or other ambient gas. The p- and n-contacts, the metal/dielectric stack to redistribute the contacts, and the electrical pads are well known in the art and are illustrated in FIG. 3 as electrical connection structure 22.

The semiconductor structure 20 is connected to a support 24 through electrical connection structure 22. Support 24 is a structure that mechanically supports semiconductor structure 20 and that is diced at the same time as semiconductor structure 20, when the wafer of devices is divided into individual or groups of devices. Support 24 is attached to semiconductor structure 20 on a wafer scale. In some embodiments, support 24 is a self-supporting structure suitable to attach the semiconductor light emitting device to a substrate such as a PC board. For example, the surface of support 24 opposite semiconductor structure 20 (the bottom surface of support 24 in FIG. 3) may be reflow-solderable. Any suitable support may be used. Examples of suitable supports 24 include (1) an insulating or semi-insulating wafer with conductive vias for forming electrical connections to the electrical connection structure 22, such as a silicon wafer, which may be attached to the semiconductor structure by, for example, gold-gold interconnects, (2) thick metal bonding pads formed on electrical connection structure 22, for example by plating, or (3) any other suitable mount.

Figure 5:
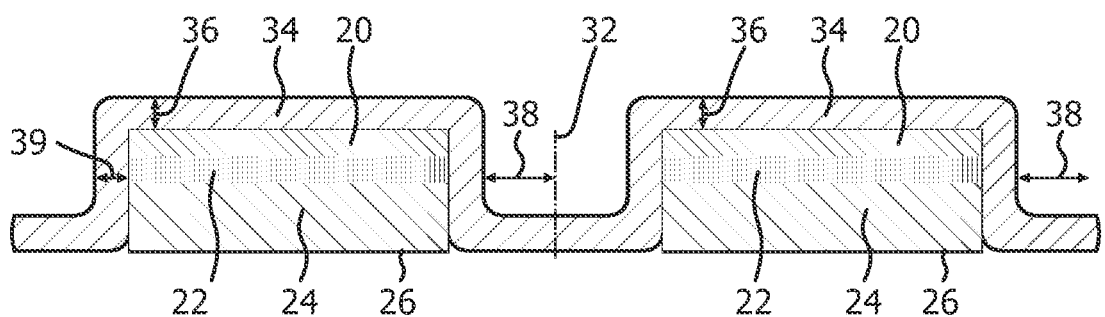
FIG. 5 is a cross sectional view of a wavelength-converted light emitting device according to embodiments of the invention.

In stage 12 of FIG. 2, the individual semiconductor devices on the wafer illustrated in FIG. 3 are tested to identify good devices, and optionally to identify characteristics of each device, such as the peak emission wavelength, brightness, etc. The wafer including the semiconductor structure 20, electrical connection structure 22, and support 24 is then diced, to divide the wafer into individual devices or groups of devices. In some embodiments, the growth substrate is removed from the semiconductor structure before dicing, as is known in the art. In some embodiments, the growth substrate remains part of the final structure and is therefore diced at the same time as the semiconductor structure. In some embodiments, the semiconductor structure is diced with the growth substrate still attached, then the growth substrate is later removed at a die-level rather than a wafer level. Dicing can be performed by any suitable method such as scribe-and-break with a laser scribe or sawing and is well known in the art. Since the semiconductor structure 20, connection structure 22 and support 24 are diced at the same time, support 24 is substantially the same width as the semiconductor structure 20 for each device or group of devices, as illustrated below in FIG. 5. The device may have substantially vertical sidewalls, as illustrated in FIG. 5.

Figure 4:
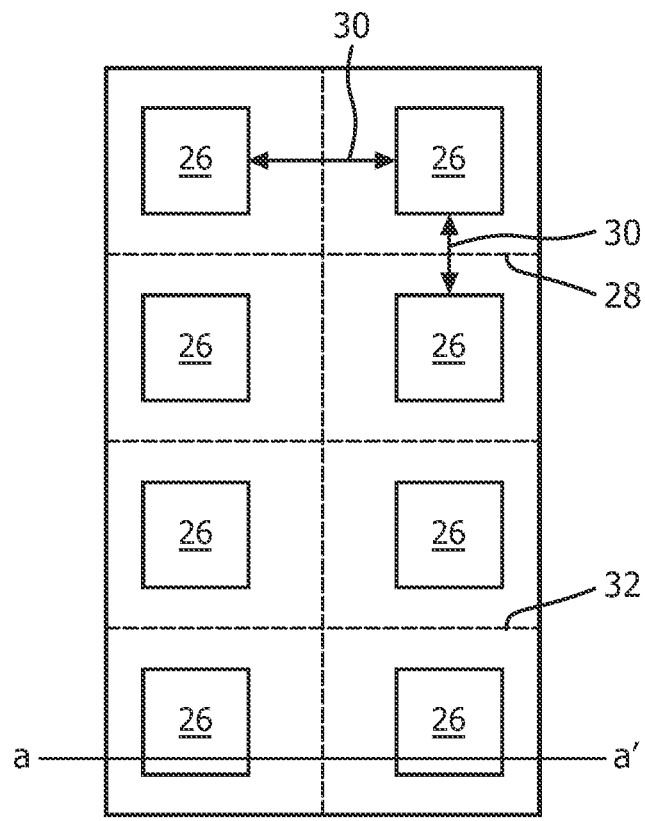
FIG. 4 is a plan view of a reconstituted wafer.

In stage 14, a reconstituted wafer of devices is formed. A reconstituted wafer is illustrated in FIG. 4. Individual devices or groups of devices 26 diced in stage 12 are connected to a substrate 28. Substrate 28 can be any suitable structure that supports devices 26, such as an inflexible structure such as a board or a flexible structure such as wafer handling tape, for example. In some embodiments, only known good devices, based on the test described above in reference to stage 12, are connected to substrate 28 in the reconstituted wafer. Since device testing is done before wavelength converting material is applied in stage 16 and only good devices are used, no wavelength converting material is wasted on bad devices (i.e. nonfunctional or non-light-emitting devices), which may reduce cost. In some embodiments, based on the test described above in reference to stage 12, only devices that emit light within the same peak wavelength range are connected to substrate 28 in the reconstituted wafer, such that the wavelength converting material can be matched to the peak emission wavelength of the devices, which may improve yield. For example, a suitable peak wavelength range may be as narrow as 5 nm in some embodiments. In some embodiments, the wafer of devices is attached to handling tape, diced while attached to the handling tape, then the reconstituted wafer is formed by stretching the handling tape to separate the devices after dicing.

In some embodiments, the spacing 30 between devices 26 on the reconstituted wafer is at least as wide as required to cleave the wavelength converting material formed over the wafer, described below. In some embodiments, the spacing may be wide enough to create an overhang 38 (illustrated in FIG. 5) of wavelength converting material on the sides of the devices. The overhang may be, for example, at least as thick as the wavelength converting material layer, or it may be wider or narrower. The dotted lines 32 on FIG. 4 show where the wavelength converting material layer is cleaved to separate the devices on the reconstituted wafer, described below in stage 18. In one example, the wavelength converting material layer is 50 μm thick. The spacing 30 between devices 26 may be at least 100 μm, such that the overhang of wavelength converting material on the sides of each device 26 is at least 50 μm. In some embodiments, the devices are spaced such that no overhang 38 is created.

In some embodiments, the aspect ratio of the reconstituted wafer is selected to match the shape of a pre-fabricated wavelength converting film. For example, the wafer which is diced in stage 12 is typically a round wafer. The reconstituted wafer formed in stage 14 may be rectangular, sized to match a rectangular sheet of pre-fabricated wavelength-converting film.

In stage 16 of FIG. 2, a wavelength-converting material is applied over the devices 26 on the reconstituted wafer. The wavelength converting material may be formed such that all or only a portion of the light emitted by the light emitting device and incident on the wavelength converting material may be converted by the wavelength converting material. Unconverted light emitted by the light emitting device may be part of the final spectrum of light, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting material, and a UV-emitting LED combined with blue-, green-, and red-emitting wavelength converting materials. Wavelength converting materials emitting other colors of light may be added to tailor the spectrum of light emitted from the device. The wavelength converting material may be conventional phosphor particles, organic semiconductors, II-VI or III-V semiconductors, II-VI or III-V semiconductor quantum dots or nanocrystals, dyes, polymers, or materials such as GaN that luminesce. Phosphor particles may have an average diameter between 5 and 50 μm in some embodiments. Any suitable phosphor may be used, including but not limited to garnet-based phosphors such as $Y_3Al_5O_{12}$:Ce (YAG), $Lu_3Al_5O_{12}$:Ce (LuAG), $Y_3Al_{5-x}O_{12}$:Ce (YAlGaG), $(Ba_{1-x}Sr_x)SiO_3$:Eu (BOSE), and nitride-based phosphors such as (Ca,Sr)AlSiN$_3$:Eu and (Ca,Sr,Ba)$_2$Si$_5$N$_8$:Eu.

The wavelength converting material is formed to conformally coat devices 26 on the reconstituted wafer with a substantially uniform thickness. For example, the thickness of the wavelength converting material over the top and sides of each device and between devices may vary less than 50% in some embodiments, less than 20% in some embodiments, and less than 10% in some embodiments. One example of a wavelength converting material is a luminescent film, formed as follows: one or more conventional powder phosphors are mixed with a binder such as acrylic or silicone to achieve a target phosphor density. The phosphor/binder sheet is formed to have a target thickness, for example by spinning the mixture on a flat surface or molding the phosphor sheet. Phosphor may be mixed with a binder in liquid form which is then cured or dried to form a flexible luminescent film. The luminescent film is pressed over the reconstituted wafer in stage 16. In some embodiments, wavelength converting material is molded over devices 26, for example by placing a mold over devices 26, filling the mold with phosphor mixed with binder material, curing the binder material, then removing the mold.

Other optional materials such as filters, dichroics, optics, or lenses may be formed over devices 26 on the reconstituted wafer, before or after the wavelength converting material is formed over devices 26.

In stage 18 of FIG. 2, the wavelength converting material formed over the reconstituted wafer is cleaved to separate the devices or groups of devices 26. FIG. 5 illustrates a single device after being separated from the reconstituted wafer in stage 18. Wavelength converting material 34 covers the top and sides of semiconductor structure 20 and support 24 to prevent leakage of unconverted light from the sides of semiconductor structure 20. The width of optional overhang 38 on the sides of device 26 depends on the spacing on the reconstituted wafer, as described above.

The embodiments described above may have advantages over the method illustrated in FIG. 1. Cleaving a wavelength converting material in stage 18 of FIG. 2 (such as a 50 μm thick phosphor and silicone film for example) is easier than cleaving a semiconductor wafer, carrier wafer, and ceramic phosphor as described above in process 116 of FIG. 1. In addition, in embodiments of the invention only known good die are covered with wavelength converting material. Ease of cleaving and using only known good devices may improve yield and reduce cost.

Having described the invention in detail, those skilled in the art will appreciate that, given the present disclosure, modifications may be made to the invention without departing from the spirit of the inventive concept described herein.

What is being claimed is:

1. A method comprising:
providing a plurality of light emitting devices, each of the plurality of light emitting devices comprising an insulating support attached to a semiconductor structure comprising a light emitting layer, a first surface facing away from the light emitting layer, a first side surface and a second side surface substantially perpendicular to the first surface such that the semiconductor structure and insulating support are contained within the first side surface, the second side surface, and a third plane opposite the first surface, such that the insulating support is on a same side of the light emitting layer as the third plane;
attaching the plurality of light emitting devices to a substrate; spacing the plurality of light emitting devices apart on the substrate;
providing a prefabricated sheet comprising phosphor particles in a transparent binder material; and
applying the prefabricated sheet over the plurality of light emitting devices such that the prefabricated sheet is in contact with and covers the first surface, covers the first side surface and the second side surface, a first portion of the prefabricated sheet in contact with and covering the first surface forming a first plane, a second portion of the prefabricated sheet covering the first side surface forming a second plane intersecting with and perpendicular to the first plane, and a third portion of the prefabricated sheet-forming the third plane intersecting with and perpendicular to the second plane and parallel to the first plane.

2. The method of claim 1 wherein each light emitting device has substantially vertical sidewalls.

3. The method of claim 1 further comprising:
attaching insulating supports to a wafer of semiconductor structures to form a wafer of light emitting devices;
testing each light emitting device on the wafer of light emitting devices; and
dicing the wafer of light emitting devices.

4. The method of claim 3 wherein said attaching the plurality of light emitting devices to a substrate comprises attaching only light emitting devices that meet a predetermined criterion.

5. The method of claim 4 wherein the predetermined criterion is peak emission wavelength range and the prefabricated sheet is matched to the peak emission wavelength range.

6. The method of claim 1 wherein said attaching the plurality of light emitting devices to a substrate comprises:
attaching a wafer of light emitting devices to handling tape;
dicing the wafer into a plurality of light emitting devices; and
stretching the handling tape to space the plurality of light emitting devices apart before applying the prefabricated sheet over the plurality of light emitting devices.

7. The method of claim 1 wherein applying the prefabricated sheet comprises pressing the prefabricated sheet over the plurality of light emitting devices by forming the prefabricated sheet with a substantially uniform thickness to cover the first surface, the first side surface, and the second side surface.

8. The method of claim 1 wherein the insulating support is connected to the semiconductor structure by gold-gold interconnects.

9. The method of claim 1 further comprising:
generating the plurality of light emitting devices by:
attaching a wafer of semiconductor structures to a wafer of insulating supports; and
dicing the wafer of semiconductor structures and the wafer of insulating supports in a single dicing operation.

10. The method of claim 9 further comprising:
growing a wafer of semiconductor structures on a growth substrate; and
after said attaching the wafer of semiconductor structures to the wafer of insulating supports, removing the growth substrate.

11. A method for generating a plurality of light emitting devices, the method comprising:
providing a wafer of semiconductor structures attached to a wafer of insulating supports;
dicing the wafer of semiconductor structures and the wafer of insulating supports into a plurality of light emitting devices;
attaching the plurality of light emitting devices to a substrate, each light emitting device being spaced apart from at least one other light emitting device, each light emitting device comprising an insulating support attached to a semiconductor structure comprising a light emitting layer, a first surface facing away from the light emitting layer, a first side surface and a second side surface substantially perpendicular to the first surface such that the semiconductor structure and insulating support are contained within the first side surface, the second side surface, and a third plane; and
molding a wavelength converting material over the plurality of light emitting devices such that the wavelength converting material is in contact with and covers the first surface, covers the first side surface, and the second side surface, a first portion of the wavelength converting material that covers the first surface forming a first plane, a second portion of the wavelength converting material that covers the first side surface forming a second plane intersecting with and perpendicular to the first plane, and a third portion of wavelength converting material forming the third plane intersecting with and perpendicular to the second plane and parallel to the first plane.

12. The method of claim 11 wherein the insulating support comprises a thick metal layer.

13. The method of claim 11 further comprising:
testing each light emitting device on the wafer of light emitting devices.

14. The method of claim 13 wherein said attaching a plurality of light emitting devices to a substrate comprises attaching only light emitting devices that meet a predetermined criterion.

15. The method of claim 14 wherein the predetermined criterion is peak emission wavelength range and the wavelength converting material is matched to the peak emission wavelength range.

16. The method of claim 11 wherein said attaching a plurality of light emitting devices to a substrate comprises:
attaching the plurality of light emitting devices to handling tape; and stretching the handling tape to space the plurality of light emitting devices apart before molding the wavelength converting material over the plurality of light emitting devices.

* * * * *